(12) United States Patent
Karp

(10) Patent No.: US 11,398,469 B1
(45) Date of Patent: Jul. 26, 2022

(54) ELECTROSTATIC DISCHARGE (ESD) PROTECTION IN STACKED CHIPS

(71) Applicant: XILINX, INC., San Jose, CA (US)

(72) Inventor: James Karp, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 248 days.

(21) Appl. No.: 16/836,770

(22) Filed: Mar. 31, 2020

(51) Int. Cl.
- *H01L 23/60* (2006.01)
- *H01L 27/02* (2006.01)
- *H01L 23/64* (2006.01)
- *H01L 25/065* (2006.01)

(52) U.S. Cl.
CPC .......... *H01L 27/0288* (2013.01); *H01L 23/60* (2013.01); *H01L 23/647* (2013.01); *H01L 25/0657* (2013.01)

(58) Field of Classification Search
None
See application file for complete search history.

(56) References Cited

U.S. PATENT DOCUMENTS

| | | |
|---|---|---|
| 5,477,414 A | 12/1995 | Li et al. |
| 5,610,790 A | 3/1997 | Staab et al. |
| 5,623,387 A | 4/1997 | Li et al. |
| 5,689,133 A | 11/1997 | Li et al. |
| 5,959,821 A | 9/1999 | Voogel |
| 6,268,639 B1 | 7/2001 | Li et al. |
| 6,645,802 B1 | 11/2003 | Li et al. |
| 6,740,936 B1 | 5/2004 | Gitlin et al. |
| 6,972,939 B1 | 12/2005 | Ho et al. |
| 6,978,541 B1 | 12/2005 | Feltner et al. |
| 7,372,679 B1 | 5/2008 | Ho et al. |
| 7,872,346 B1 | 1/2011 | Chee et al. |
| 8,181,140 B2 | 5/2012 | Kireev et al. |
| 8,866,229 B1 | 10/2014 | Fakhruddin et al. |
| 8,881,085 B1 | 11/2014 | Karp et al. |
| 8,947,839 B2 | 2/2015 | Karp |
| 8,982,581 B2 | 3/2015 | Karp et al. |
| 9,013,845 B1 | 4/2015 | Karp |
| 9,136,690 B1 | 9/2015 | Upadhyaya et al. |
| 9,245,852 B2 | 1/2016 | Chen et al. |
| 9,548,738 B2 | 1/2017 | Karp |
| 9,711,500 B1 * | 7/2017 | Walker ................ H01L 27/0248 |
| 9,979,186 B2 | 5/2018 | Chang et al. |
| 10,074,647 B2 | 9/2018 | Lai et al. |
| 10,497,677 B1 | 12/2019 | Karp |

(Continued)

*Primary Examiner* — Benjamin P Sandvik

(74) *Attorney, Agent, or Firm* — Patterson + Sheridan, LLP

(57) ABSTRACT

Examples described herein generally relate to devices that include electrostatic discharge (ESD) protection in a chip stack. In an example, a device includes a chip stack including first and second chips, ground and power supply voltage nodes, and first and second resistor-capacitor (RC) clamps. The second chip is disposed on and attached to the first chip. The ground and power supply voltage nodes are connected between and extend in the first and second chips, and are connected to the ground and power supply voltage exterior connector pads, respectively, of the first chip. The first and second RC clamps are disposed in the first and second chips, respectively. The first and second RC clamps are connected to and between the ground node and the power supply voltage node. An RC-time constant of the second RC clamp is less than an RC-time constant of the first RC clamp.

20 Claims, 5 Drawing Sheets

(56) References Cited

U.S. PATENT DOCUMENTS

| | | | |
|---|---|---|---|
| 2014/0126089 A1* | 5/2014 | Chang | H02H 9/046 |
| | | | 361/56 |
| 2015/0214211 A1* | 7/2015 | Ma | H01L 27/0255 |
| | | | 257/491 |
| 2015/0288172 A1 | 10/2015 | Yeh et al. | |
| 2018/0005940 A1* | 1/2018 | Chen | H01L 25/50 |
| 2020/0343237 A1* | 10/2020 | Karp | H01L 27/0255 |

* cited by examiner

ELECTROSTATIC DISCHARGE (ESD) PROTECTION IN STACKED CHIPS

TECHNICAL FIELD

Examples of the present disclosure generally relate to multi-chip stacked devices containing stacked chips, and more particularly, to electrostatic discharge (ESD) protection in the stacked chips.

BACKGROUND

Apparatuses, including modules and/or packages, that include multiple integrated circuit (IC) chips have been developed. The forms of such apparatuses are varied. By forming such apparatuses, an electronic device can integrate multiple chips to form the device, where each chip can be manufactured using standard semiconductor processing to then be assembled and packaged to form a larger, multi-functional device. By having different chips, in some instances, semiconductor processing that is difficult to integrate can be separated, such as when parts of one chip require a different process from another chip.

Another aspect is an ability to build a device having chips with different functionalities (for example, some are field programmable gate array (FPGA) chips and some are memory chips) into a same apparatus with a smaller device size and more functionality and lower power. Semiconductor processes for a chip can be more focused to give devices a greater edge in areas such as increased performance of the chip, reduced costs, and increased yield in manufacturing. Other benefits can be realized by such apparatuses.

IC chips can also include circuitry for electrostatic discharge (ESD) protection. Currently, ESD routing provides a low resistive path from, e.g., solder bumps on the IC package down to active circuitry on the semiconductor substrate of the IC chip. An ESD path readily allows for mitigation and avoidance of ESD current crowding.

SUMMARY

Examples described herein generally relate to devices that include electrostatic discharge (ESD) protection in a chip stack. A RC-time constant of a resistor-capacitor (RC) clamp on a base chip in a chip stack can be greater than a RC-time constant of a RC clamp on other chip(s) of the chip stack. The smaller RC-time constant can be achieved by a resistor and capacitor that have a smaller footprint in the chip, which can save costs of manufacturing the chip.

An example described herein is a device. The device includes a chip stack including a first chip, a second chip, a ground node, a power supply voltage node, a first RC clamp, and a second RC clamp. The first chip has a ground exterior connector pad and a power supply voltage exterior connector pad. The second chip is disposed on and attached to the first chip. The ground node is connected between and extends in the first chip and the second chip. The ground node is connected to the ground exterior connector pad. The power supply voltage node is connected between and extends in the first chip and the second chip. The power supply voltage node is connected to the power supply voltage exterior connector pad. The first RC clamp is disposed in the first chip, and the first RC clamp is connected to and between the ground node and the power supply voltage node. The second RC clamp is disposed in the second chip, and the second RC clamp is connected to and between the ground node and the power supply voltage node. An RC-time constant of the second RC clamp is less than an RC-time constant of the first RC clamp.

Another example described herein is a method of providing a device. A first chip is provided. The first chip includes: a ground exterior connector pad connected to a first ground node in the first chip; a power supply voltage exterior connector pad connected to a first power supply voltage node in the first chip; and a first RC clamp connected to and between the first ground node and the first power supply voltage node. A second chip is provided. The second chip includes a second RC clamp connected to and between a second ground node in the second chip and a second power supply voltage node in the second chip. An RC-time constant of the second RC clamp is less than an RC-time constant of the first RC clamp. The second chip is attached to and disposed on the first chip. Attaching the second chip to the first chip includes connecting the first ground node to the second ground node to form a ground node extending in the first chip and the second chip, and includes connecting the first power supply voltage node to the second power supply voltage node to form a power supply voltage node extending in the first chip and the second chip.

Another example described herein is a device. The device includes a first chip and a second chip. The first chip includes: a ground exterior connector pad connected to a ground node; a power supply voltage exterior connector pad connected to a power supply voltage node; and a first RC clamp connected to and between the ground node and the power supply voltage node. The second chip is bonded to and disposed on the first chip. The ground node and the power supply voltage node extend in the second chip. The second chip includes a second RC clamp connected to and between the ground node and the power supply voltage node. An RC-time constant of the second RC clamp is less than an RC-time constant of the first RC clamp.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
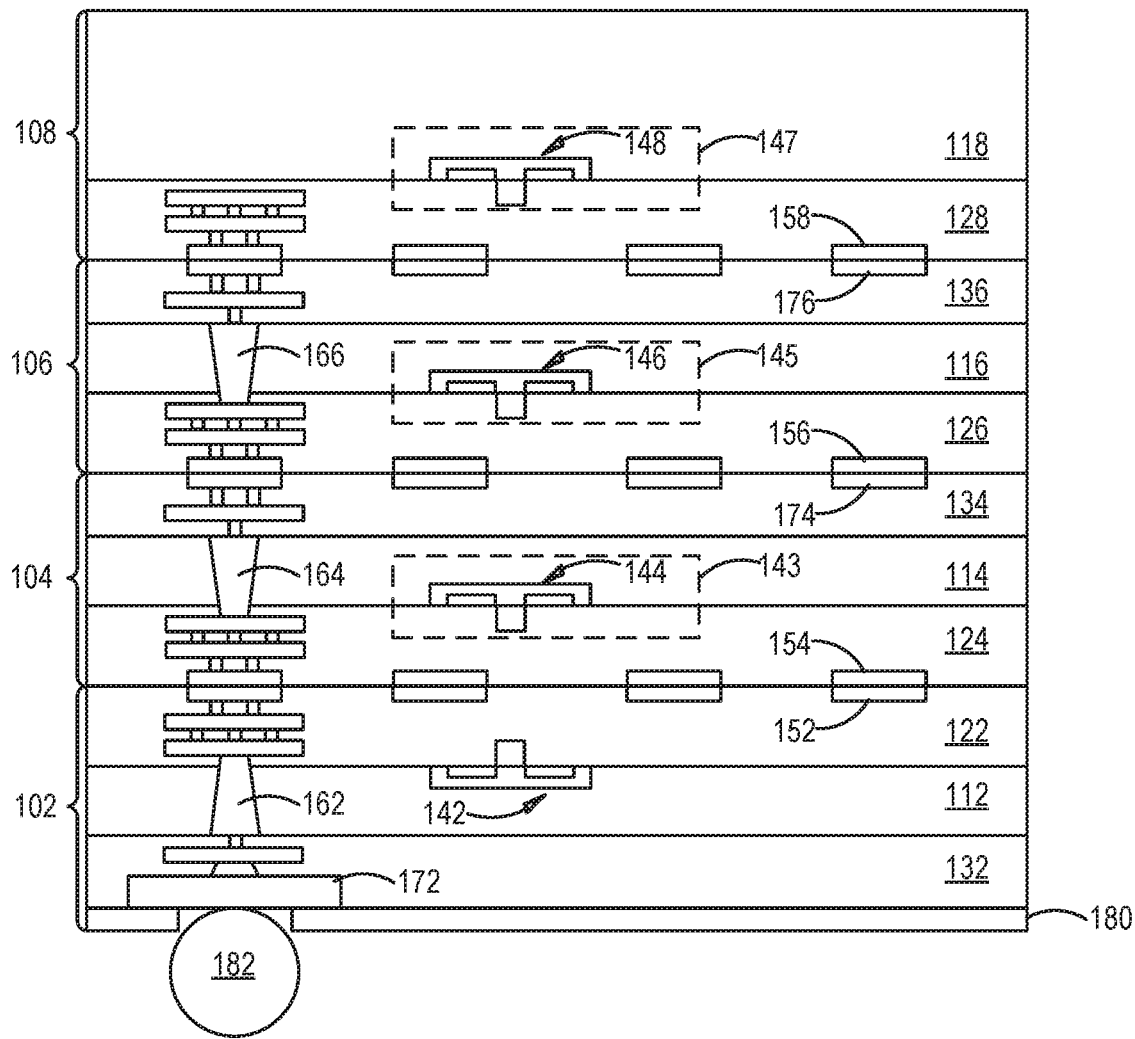
FIG. 1 is a structure of a multi-chip device having a chip stack according to some examples.

Examples described herein generally relate to devices that include electrostatic discharge (ESD) protection in a chip stack. The chip stack can include multiple chips where neighboring ones of the chips are attached (e.g., bonded) to each other. A power domain is distributed through two or more of the chips of the chip stack. For example, a power supply voltage node and a ground node extends into and between the two or more chips of the chip stack. Each chip of the two or more chips includes a resistor-capacitor (RC) clamp connected between the power supply voltage node and the ground node. The RC-time constant of the RC clamp on a base chip (e.g., that has exterior connector pads for external connectors) is greater than the RC-time constant of the RC clamp on other chip(s) of the chip stack.

In ESD modeling, an ESD event can be modeled according to the Human Body Model (HBM) and the Charged Device Model (CDM). In a chip stack like generally described above, discharge paths caused according to the HBM and CDM can be decoupled. A discharge path caused according to the HBM can be contained within a base chip (e.g., that has exterior connector pads for external connectors), and that discharge path may avoid penetrating another chip in the chip stack. Hence, chip(s) other than the base chip can include an RC clamp that protects against ESD events caused according to the CDM, which typically have decay times significantly shorter than ESD events caused according to the HBM. The RC clamps on chip(s) other than the base chip may avoid being designed for ESD events caused according to the HBM. This permits the RC-time constant of the RC clamps on chip(s) other than the base chip to be less than the RC-time constant of the RC clamp on the base chip. The smaller RC-time constant can be achieved by a resistor and capacitor that have a smaller footprint in the chip, which can save costs of manufacturing the chip.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

FIG. 1 is a structure of a multi-chip device according to some examples. The multi-chip device of FIG. 1 includes a chip stack that includes a base chip 102, intermediate chips 104, 106, and a distal chip 108. The base chip 102, intermediate chips 104, 106, and distal chip 108 are described herein as examples. Although the different chips are described herein as being or including various integrated circuits (ICs) or components (e.g., input/output, base, fabric, programmable logic, compute, etc.), aspects described herein can be generally applicable to chips of a multi-chip device having any type of IC or component.

In the multi-chip device of FIG. 1, the intermediate chips 104, 106 and distal chip 108 are arranged active or front side facing down towards the base chip 102, where the base chip 102 is arranged active or front side facing up towards the intermediate chips 104, 106 and distal chip 108. In other multi-chip devices, the intermediate chips 104, 106 are arranged active or front side facing up away from the base chip 102, and the distal chip 108 is arranged active or front side facing down towards the base chip 102, where the base chip 102 is arranged active or front side facing up towards the intermediate chips 104, 106 and distal chip 108. Various other multi-chip devices can have different structures, different number of chips, additional components, etc.

Generally, the chips 102-108 are stacked and form a chip stack in the multi-chip device. The chips 102-108 are stacked to form, in some examples, an Active die-on-Active die (AoA) device. Each of the chips 102-108 can include an active IC. In some examples, more or fewer chips can be included in the chip stack. For example, a multi-chip device can have two chips (such as a base chip and a distal chip), can have three chips (such as a base chip, an intermediate chip, and a distal chip), or can have four or more chips (such as a base chip, two or more intermediate chips, and a distal chip). In some examples, a multi-chip device can have three chips, four chips, five chips, etc.

Each of the chips 102-108 includes a respective semiconductor substrate 112, 114, 116, 118 and respective front side dielectric layer(s) 122, 124, 126, 128 on a front side of the respective semiconductor substrate 112-118. The front side dielectric layer(s) 122-128 include metallization (e.g., metal lines and/or vias) (illustrated but not specifically numbered) formed therein which can electrically connect various components in an IC. Each of the chips 102, 104, 106 includes respective backside dielectric layer(s) 132, 134, 136 on a backside of the respective semiconductor substrate 112, 114, 116. The backside dielectric layer(s) 132, 134, 136 include metallization (e.g., metal lines and/or vias) (illustrated but not specifically numbered) formed therein which can electrically connect various components in an IC. Although not specifically illustrated, metallization in front side dielectric layer(s) 124, 126, 128 of the chips 104, 106, 108 connect to respective circuit regions 143, 145, 147 of the chips 104, 106, 108 in which respective active circuits can be formed. Such connections and example active circuits will be described in further detail below in the context of subsequent figures.

Each semiconductor substrate 112-118 of the chips 102-108 includes, e.g., a transistor 142, 144, 146, 148 formed on and/or in the front side surface of the respective semiconductor substrate 112-118. The transistor 142, 144, 146, 148 and any other components can be connected to the metallization in the front side dielectric layer(s) 122-128. The transistor 144, 146, 148 is illustrated in the respective circuit region 143, 145, 147 of the chip 104, 106, 108; however, the transistor 144, 146, 148 and/or other transistors can be outside of the circuit region 143, 145, 147. Each semiconductor substrate 112, 114, 116 of the respective chip 102, 104, 106 has backside through-substrate via(s) (TSV(s))

162, 164, 166 therethrough, which can electrically connect the metallization in the front side dielectric layer(s) 122, 124, 126 to the metallization in the backside dielectric layer(s) 132, 134, 136 of the respective chip 102, 104, 106.

Front side bond pads 152, 154, 156, 158 (e.g., metal (e.g., Cu) bond pads) are formed in the respective front side dielectric layer(s) 122-128 of the chips 102-108 at an exterior surface distal from the respective semiconductor substrate 112-118. The front side bond pads 152-158 can be in an arrangement that forms a respective chip-to-chip interface. The front side bond pads 152-158 are connected to the metallization in the respective front side dielectric layer(s) 122-128. Backside bond pads 174, 176 (e.g., metal (e.g., Cu) bond pads) are formed in the respective backside dielectric layer(s) 134, 136 of the intermediate chips 104, 106 at an exterior surface distal from the respective semiconductor substrate 114, 116. The backside bond pads 174, 176 can be in an arrangement that forms a respective chip-to-chip interface. The backside bond pads 174, 176 are connected to the metallization in the respective backside dielectric layer(s) 134, 136.

Exterior connector backside pads 172 (e.g., metal (e.g., aluminum) pads) are formed in the backside dielectric layer(s) 132 of the base chip 102 at an exterior surface distal from the semiconductor substrate 112 of the base chip 102. The exterior connector backside pads 172 are connected to the metallization in the backside dielectric layer(s) 132 of the base chip 102. A passivation layer 180 is formed on the exterior surface distal from the semiconductor substrate 112 of the base chip 102 with respective openings therethrough exposing the exterior connector backside pads 172. External connectors 182 (e.g., controlled collapse chip connections (C4), minibumps, etc.) are formed on respective exterior connector backside pads 172 through the openings in the passivation layer 180.

The external connectors 182 can be attached to a package substrate. The package substrate may further be attached to, e.g., a printed circuit board (PCB) to attach the package substrate (and hence, the multi-chip device) to the PCB. Various other components can be included in a multi-chip device. For example, an interposer, an encapsulant (such as a molding compound (MUF) or the like), etc. can be included in the multi-chip device. A person having ordinary skill in the art will readily envision various modifications that can be made to the multi-chip device.

The chips 102-108 are bonded (e.g., by hybrid bonding using metal-to-metal and oxide-to-oxide bonding) together to form a chip stack. The base chip 102 is bonded to the intermediate chip 104 front side to front side such that the front side bond pads 152 and exterior surface of the front side dielectric layer(s) 122 of the base chip 102 are bonded to the front side bond pads 154 and exterior surface of the front side dielectric layer(s) 124 of the intermediate chip 104. The intermediate chip 104 is bonded to the intermediate chip 106 backside to front side such that the backside bond pads 174 and exterior surface of the backside dielectric layer(s) 134 of the intermediate chip 104 are bonded to the front side bond pads 156 and exterior surface of the front side dielectric layer(s) 126 of the intermediate chip 106. The intermediate chip 106 is bonded to the distal chip 108 backside to front side such that the backside bond pads 176 and exterior surface of the backside dielectric layer(s) 136 of the intermediate chip 106 are bonded to the front side bond pads 158 and exterior surface of the front side dielectric layer(s) 128 of the distal chip 108.

Other arrangements of bonding can be implemented. For example, the base chip 102 can be bonded to the intermediate chip 104 front side to backside such that the front side bond pads 152 and exterior surface of the front side dielectric layer(s) 122 of the base chip 102 are bonded to the backside bond pads 174 and exterior surface of the backside dielectric layer(s) 134 of the intermediate chip 104. The intermediate chip 104 can be bonded to the intermediate chip 106 front side to backside such that the front side bond pads 154 and exterior surface of the front side dielectric layer(s) 124 of the intermediate chip 104 are bonded to the backside bond pads 176 and exterior surface of the backside dielectric layer(s) 136 of the intermediate chip 106. The intermediate chip 106 can be bonded to the distal chip 108 front side to front side such that the front side bond pads 156 and exterior surface of the front side dielectric layer(s) 126 of the intermediate chip 106 are bonded to the front side bond pads 158 and exterior surface of the front side dielectric layer(s) 128 of the distal chip 108.

In other examples, the chips 102-108 can be attached together using external connectors (such as minibumps, solder, etc.). In some examples, some of the chips 102-108 can be attached together by external connectors while others of the chips can be bonded together without use of external connectors. Any permutation of bonding and use of external connectors can be implemented.

In some examples, the base chip 102 includes an interconnect that is capable of transmitting signals generally horizontally (e.g., parallel to the front side surface of the semiconductor substrate 112). The interconnect can be electrically and communicatively coupled to the other chips of the chip stack. Signals can be transmitted in the interconnect of the base chip 102 and then vertically (through metallizations and TSVs of various chips) to an appropriate chip in the chip stack. Additionally, the base chip 102 includes appropriate input/output circuits for receiving signals from a source and/or transmitting signals to a destination outside of the chip stack of the multi-chip device. The base chip 102 can further include other circuits. For example, the base chip 102 can be or include a processing IC and may further be a System-on-Chip (SoC).

In some examples, each of the intermediate chips 104, 106 and distal chip 108 includes a processing IC (such as a fabric IC and compute IC which are further described below). A processing IC can generally include any circuit configured to or configurable to process any data and/or signal and output data and/or a signal resulting from that processing, and is more than merely memory and any circuit ancillary to memory (e.g., address decoder, memory controller, etc.). The processing IC of the intermediate chips 104, 106 can be a same IC in some examples. The hardware topology, architecture, and layout of the intermediate chips 104, 106 can be the same in some examples. In some examples, the processing IC of the intermediate chips 104, 106 includes one or more programmable logic regions (e.g., fabric of a FPGA), which has the same hardware topology, architecture, and layout between the intermediate chips 104, 106. In other examples, the intermediate chips 104, 106 are different ICs.

The distal chip 108 can be or include any IC. For example, the distal chip 108 can be or include a processing IC or memory. In some examples, the distal chip 108 is an application specific IC (ASIC). In some examples, the distal chip 108 is a same processing IC as one or both of the intermediate chips 104, 106 except without, e.g., TSVs and backside dielectric layer(s) and metallizations therein. In other examples, the intermediate chips 104, 106 and distal chips 108 can each be a different IC. In still other examples, the chips 104-108 can each be or include any permutation of being or including a same IC and/or different ICs. Any intermediate chip 104, 106 or distal chip 108 may generically be referred to as an active chip.

Figure 2:
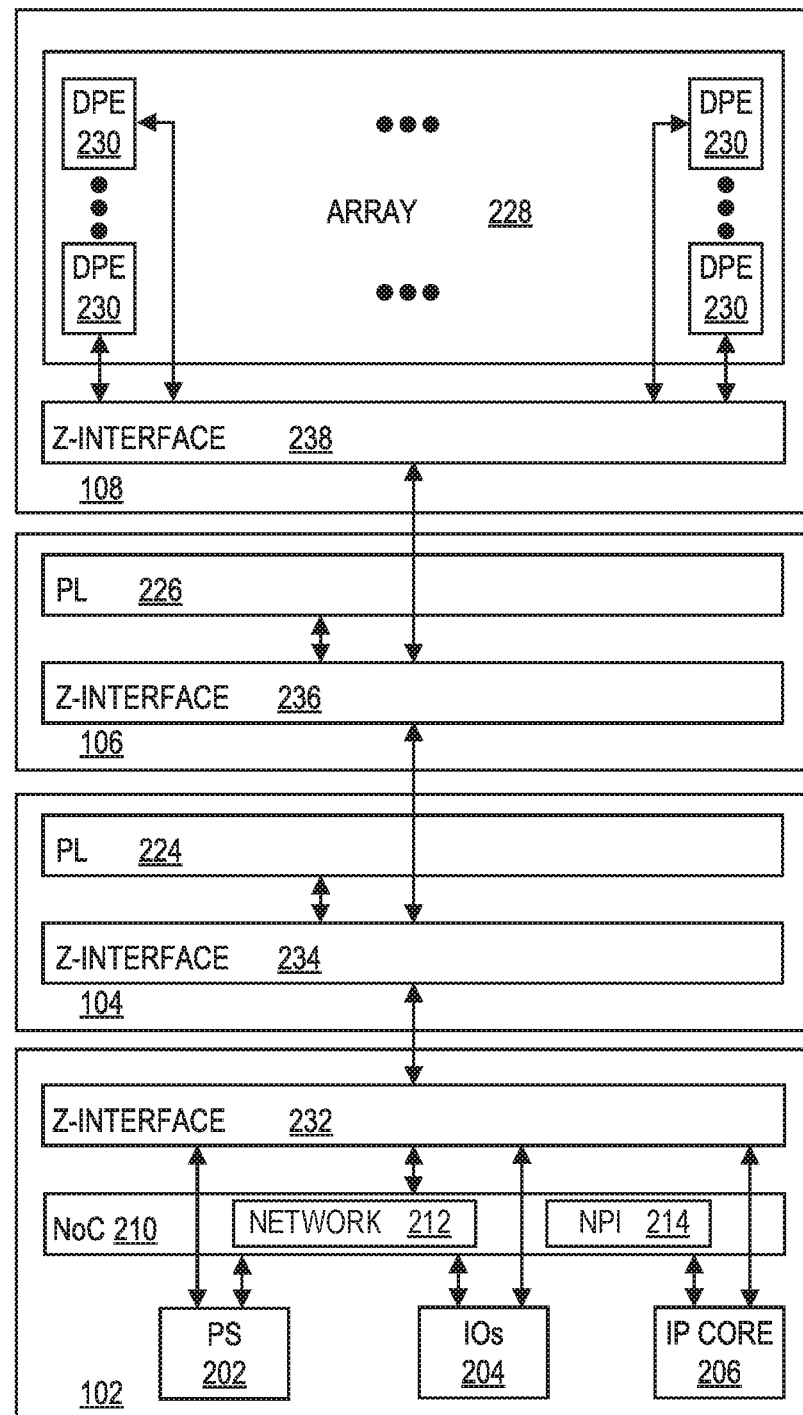
FIG. 2 is a block diagram of a circuit schematic depicting integrated circuits of the chip stack of the multi-chip device of FIG. 1 according to some examples.

FIG. 2 is a block diagram of a circuit schematic depicting ICs of a chip stack of the multi-chip device of FIG. 1 according to some examples. In the illustrated example, the multi-chip device is a multi-chip programmable device. The circuit schematic can be implemented in the multi-chip device of FIG. 1, e.g., regardless of the orientation of the intermediate chips 104, 106.

In the illustrated example, the base chip 102 includes a base IC on the base chip 102, which may be a SoC. The intermediate chips 104, 106 include a respective fabric IC, which in some examples, is a same IC and has a same hardware layout and topology. The distal chip 108 includes a compute IC. These ICs are provided as an example implementation. Other ICs (e.g., with other hard IP blocks) can be implemented in the chips.

The base IC on the base chip 102 includes a processing system 202, input/output circuits (IOs) 204, IP core circuits 206, a Network-on-Chip (NoC) 210, and a Z-interface 232. The processing system 202 may be or include any of a variety of different processor types and number of processor cores. For example, the processing system 202 may be implemented as an individual processor, e.g., a single core capable of executing program instruction code. In another example, the processing system 202 may be implemented as a multi-core processor. The processing system 202 may be implemented using any of a variety of different types of architectures. Example architectures that may be used to implement the processing system 202 may include an ARM processor architecture, an x86 processor architecture, a graphics processing unit (GPU) architecture, a mobile processor architecture, a reduced instruction set computer (RISC) architecture (e.g., RISC-V), or other suitable architecture that is capable of executing computer-readable program instruction code.

The input/output circuits 204 can include eXtreme Performance Input/Output (XPIO), multi-gigabit transceivers (MGTs), high bandwidth memory (HBM) interfaces, Analog-to-Digital Converters (ADC), Digital-to-Analog Converters (DAC), or any other input/output blocks. The input/output circuits 204 can be configured to receive and/or transmit signals from and/or to a circuit outside of the multi-chip device. The IP core circuits 206 can include memory controllers (such as double data rate (DDR) memory controllers, high bandwidth memory (HBM) memory controllers, or the like), peripheral component interconnect express (PCIe) interfaces, cache coherent interconnect for accelerators (CCIX) interfaces, Ethernet cores (such as a media address controller (MAC) or the like), forward error correction (FEC) blocks, and/or any other hardened circuit. Any of the input/output circuits 204 and/or IP core circuits 206 can be programmable.

The NoC 210 includes a programmable network 212 and a NoC peripheral interconnect (NPI) 214. The programmable network 212 communicatively couples subsystems and any other circuits of the base IC on the base chip 102 together. The programmable network 212 includes NoC packet switches and interconnect lines connecting the NoC packet switches. Each NoC packet switch performs switching of NoC packets in the programmable network 212. The programmable network 212 has interface circuits at the edges of the programmable network 212. The interface circuits include NoC master units (NMUs) and NoC slave units (NSUs). Each NMU is an ingress circuit that connects a master circuit to the programmable network 212, and each NSU is an egress circuit that connects the programmable network 212 to a slave endpoint circuit. NMUs are communicatively coupled to NSUs via the NoC packet switches and interconnect lines of the programmable network 212. The NoC packet switches are connected to each other and to the NMUs and NSUs through the interconnect lines to implement a plurality of physical channels in the programmable network 212. The NoC packet switches, NMUs, and NSUs include register blocks that determine the operation of the respective NoC packet switch, NMU, or NSU.

The NPI 214 includes circuitry to write to register blocks that determine the functionality of the NMUs, NSUs, and NoC packet switches. The NPI 214 includes a peripheral interconnect coupled to the register blocks for programming thereof to set functionality. The register blocks in the NMUs, NSUs, and NoC packet switches of the programmable network 212 support interrupts, quality of service (QoS), error handling and reporting, transaction control, power management, and address mapping control. The NPI 214 can include an NPI root node residing on the processing system 202 (e.g., a platform management controller (PMC) of the processing system 202), interconnected NPI switches connected to the NPI root node, and protocol blocks connected to the interconnected NPI switches and a corresponding register block. The NPI 214 may be used to program any programmable circuit of the base IC on the base chip 102. For example, the NPI 214 may be used to program any input/output circuit 204 and/or IP core circuit 206 that is programmable.

The Z-interface 232 can include active circuits, such as buffers to drive signals. The Z-interface 232 provides an interface, including through metal lines and vias in metallization layers, for the processing system 202, input/output circuits 204, IP core circuits 206, and programmable network 212 of the NoC 210 to chips overlying the base chip 102 and/or a substrate (e.g., package substrate) underlying the base chip 102. Additionally, the Z-interface 232 can provide a pass-through interface, e.g., including a stack of vias and/or metal lines in metallization layers in the front side and backside dielectric layers and including TSVs, through the base chip 102.

The various subsystems and circuits of the base IC on the base chip 102 can be communicatively coupled. As illustrated, the processing system 202, input/output circuits 204, and IP core circuits 206 are connected to the NoC 210 (e.g., to the programmable network 212), and hence, are communicatively coupled to each other. The processing system 202 is further connected to the NPI 214 for communicating configuration data to various programmable components on the base chip 102. The processing system 202 is further connected to the programmable network 212 of the NoC 210 for communicating configuration data to chips overlying the base chip 102. The programmable network 212 of the NoC 210 is connected to the Z-interface 232 such that data, such as transactional data and configuration data, can be communicated through the Z-interface 232 to another chip. Each of the processing system 202, input/output circuits 204, and IP core circuits 206 is connected to the Z-interface 232 for communications with, e.g., programmable logic in the fabric ICs in overlying intermediate chips 104, 106. Other communication mechanisms, such as direct connections, between the various subsystems and circuits may be implemented.

The fabric IC on each of the intermediate chips 104, 106 includes one or more programmable logic (PL) region 224, 226, respectively, and a Z-interface 234, 236, respectively. The PL region 224, 226 is logic circuitry that may be programmed to perform specified functions. The PL region 224, 226 can include any number or arrangement of programmable tiles. As an example, PL region 224, 226 may be implemented as fabric of an FPGA. For example, the PL region 224, 226 can include any number of configurable logic blocks (CLBs), look-up tables (LUTs), digital signal processing blocks (DSPs), random access memory blocks (BRAMs), etc. Each of the programmable tiles (e.g., CLBs, LUTs, DSPs, BRAMs, etc.) can include one or more programmable interconnect elements. The various respective types of programmable tiles can be arranged in rows and/or columns, and the associate programmable interconnect elements can be connected to neighboring programmable logic elements in a same column and row, for example. The programmable interconnect element can form an interconnect network of the PL region 224, 226. Any logic and connections can be implemented by the PL region 224, 226 by programming or configuring any of the programmable tiles of the PL region 224, 226.

The Z-interface 234, 236 on each of the intermediate chips 104, 106 can include active circuits, such as buffers to drive signals. The Z-interface 234, 236 provides an interface, including through metal lines and vias in metallization layers, for the respective PL region 224, 226 to communicate with chips overlying and/or underlying the respective intermediate chip 104, 106. Additionally, the Z-interface 234, 236 can provide a pass-through interface, e.g., including a stack of vias and/or metal lines in metallization layers in the front side and backside dielectric layers and including TSVs, through the respective intermediate chip 104, 106. Configuration data for the PL regions 224, 226 can be transmitted through passive connections through Z-interfaces 234, 236, for example.

Each PL region 224, 226 can also include a configuration interconnect that includes a configuration Frame (CFRAME) driver. The CFRAME driver may be or include control logic to communicate configuration data (such as a bitstream) to configure programmable logic. Each PL region 224, 226 is configurable or programmable by configuration data received via the Z-interface 232, a corresponding Z-interface 234, 236 of the respective intermediate chip 104, 106, and any intervening Z-interface 234. For example, the processing system 202 (e.g., a PMC of the processing system 202) can transmit configuration data via the programmable network 212 of the NoC 210 and the Z-interface 232 to a respective PL region 224, 226. In some examples, a configuration interconnect (e.g., including a CFRAME driver) can direct the configuration data to appropriate programmable tiles and can control configuring such programmable tiles.

The compute IC on the distal chip 108 includes a data processing engine (DPE) array 228 and a Z-interface 238. The DPE array 228 includes DPEs 230 arranged in an array.

The Z-interface 238 can include active circuits, such as buffers to drive signals. The Z-interface 238 provides an interface, including through metal lines and vias in metallization layers, for each of the DPEs 230 to communicate with chips underlying the distal chip 108. Each of the DPEs 230 is connected to the Z-interface 238. Hence, the DPEs 230 can be connected to various systems of other chips via the Z-interface 238. The Z-interface 238 provides an interface between DPEs 230 and other subsystems, such as the PL regions 224, 226 of the intermediate chips 104, 106 and/or the programmable network 212 of the NoC 210. Configuration data for the DPEs 230 can be transmitted through connections through the Z-interface 238, for example.

Each of the DPEs 230 is a hardwired circuit block and may be programmable. Each of the DPEs 230 includes a hardened core and a memory module. The core provides data processing capabilities of the DPE 230. The core may be implemented as any of a variety of different processing circuits. In some examples, the core is implemented as a processor that is capable of executing program instruction code, e.g., computer readable program instruction code. Program memory can be included in the core and can be capable of storing program instruction code that is executed by the core. The memory module includes memory banks. The memory banks are capable of storing data that may be read and consumed by one or more core and data (e.g., results) that may be written by one or more core. The memory module can further include a direct memory access (DMA) engine for direct memory accesses to the memory banks.

Each of the DPEs 230 further includes a streaming switch and a memory mapped switch. The streaming switch is connected to the core and memory module (e.g., a DMA engine in a memory module) of the respective DPE 230. The streaming switch of a DPE 230 is connected to streaming switches in neighboring DPEs 230. The interconnected streaming switches of the DPEs 230 form a streaming network. The memory mapped switch of a DPE 230 is connected to memory mapped switch(es) of neighboring DPE(s) 230 along a given direction. The interconnected memory mapped switches of the DPEs 230 form a memory mapped network. Each of the DPEs 230 can also include configuration registers, which can be programmed to configure the core, memory module (e.g., programmable components therein), streaming switch, or any other programmable component of the respective DPE 230. The memory mapped switch can be coupled to the configuration registers for writing to or programming the configuration registers. In some examples, the streaming network and the memory mapped network can each be implemented as an on-chip interconnect, such as an Advanced Microcontroller Bus Architecture (AMBA) eXtensible Interface (AXI) bus (e.g., or switch) and/or other interconnect circuitry.

In some examples, the DPEs 230 are mapped to the address space of the processing system 202. Accordingly, any configuration registers and/or memories within any DPE 230 may be accessed via the memory mapped network. For example, the program memory, the memory banks, and configuration registers of a DPE 230 may be read and/or written via the memory mapped network (e.g., via the memory mapped switch of the respective DPE 230). Through the memory mapped network, subsystems of the multi-chip device are capable of reading or writing any configuration register, program memory, and memory bank.

DPEs 230 may be programmed by loading configuration data into respective configuration registers that define operations of the DPEs 230 (including cores, memory modules, and streaming switches), by loading program instruction code into program memory for execution by the core of the respective DPEs 230, and/or by loading application data into memory banks of the DPEs 230. The processing system 202 (e.g., a PMC of the processing system 202) can transmit configuration data, program instruction code, and/or application data via the programmable network 212 of the NoC 210 and the Z-interfaces 232-238 to one or more DPEs 230. The configuration data, program instruction code, and/or application data received from the programmable network 212 is a memory mapped transaction that is routed via the memory mapped network to a configuration register, program memory, and/or memory bank addressed by the memory mapped transaction (and hence, to a target DPE 230). The configuration data, program instruction code, and/or application data is written to the configuration register, program memory, and/or memory bank, respectively, by the memory mapped transaction.

Once the streaming network (e.g., streaming switches) is configured, cores of DPEs 230 can communicate with each other or with other subsystems via the streaming network. A core of a DPE 230 can write or read data to or from a memory module (e.g., a DMA engine) of another DPE 230 by streaming communications via the streaming network. The streaming network can route the streaming communications according to the configuration of various streaming switches as programmed in respective configuration registers.

Cores in neighboring DPEs 230 can further communicate via shared memory communications. A core of a DPE 230 can be directly connected to respective memory modules of neighboring DPEs 230. A core of a DPE 230 can directly write to a memory bank, and a core of a neighboring DPE 230 can directly read from that memory bank, which permits communication between the cores. The memory bank can therefore be shared between the cores of neighboring DPEs 230. An independent cascade stream can also be implemented between cores of DPEs 230.

Figure 3:
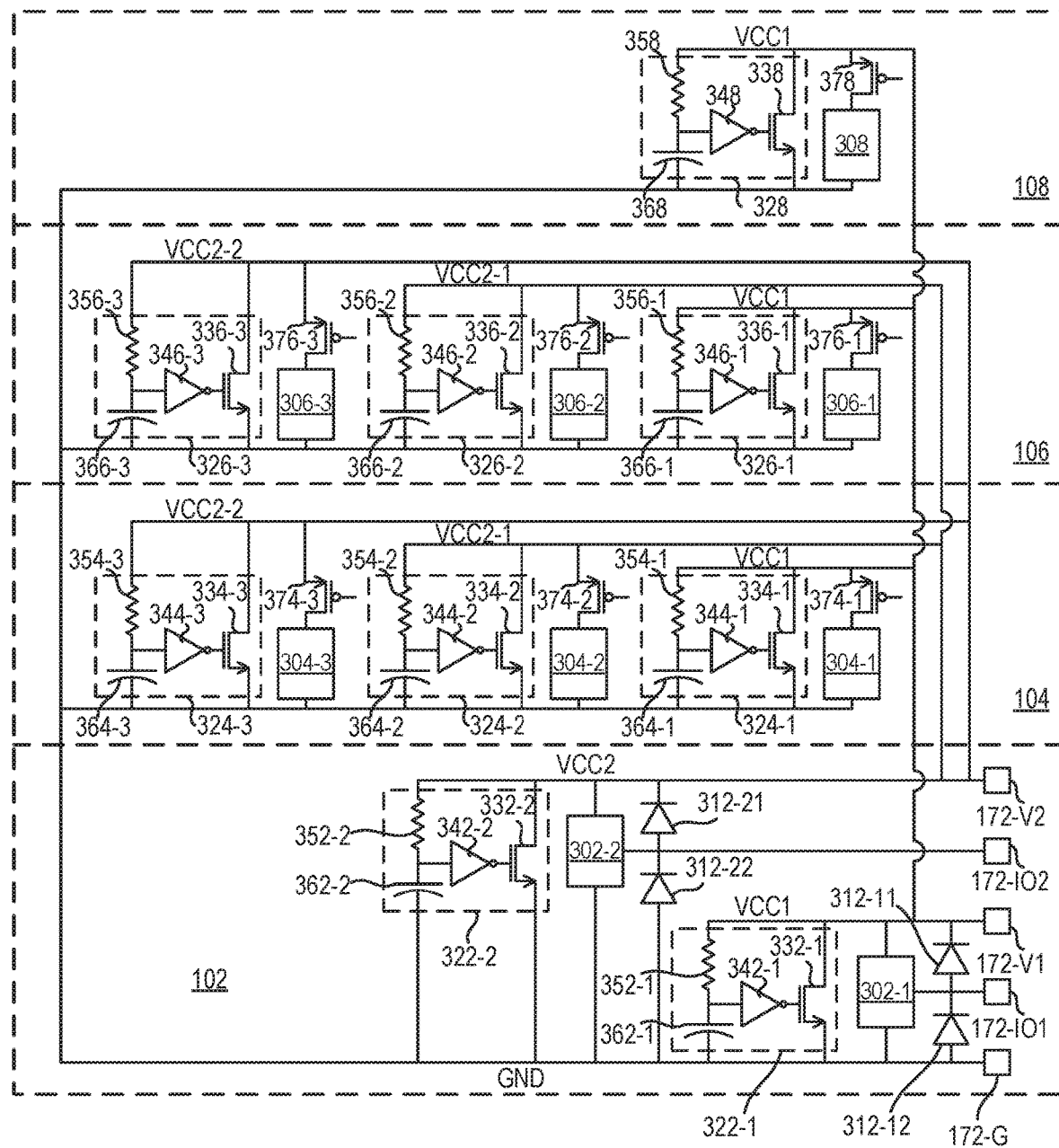
FIG. 3 is a circuit schematic of power domains with resistor-capacitor (RC) clamps throughout the chip stack of FIGS. 1 and 2 according to some examples.

FIG. 3 is a circuit schematic of power domains with resistor-capacitor (RC) clamps throughout the chip stack of FIGS. 1 and 2 according to some examples. In the discussion of the circuit of FIG. 3, a particular node and a signal or voltage on that particular node may have a same reference indicator. A person having ordinary skill in the art will readily understand when the reference indicator refers to the node or the signal/voltage based on the context of the description.

A person having ordinary skill in the art will readily appreciate the pattern of reference numerals implemented in FIG. 3. Generally, reference numerals with a "2", "4", "6" and "8" in the ones digit are in the base chip 102, intermediate chip 104, intermediate chip 106, and distal chip 108, respectively. Any numeral appended by a dash (e.g., "-") indicates a given instance of similar or same components within a respective chip. Description below may refer to components generically by using an "x" in the ones digit and omitting any numeral appended by a dash. This is to avoid unduly repeating the same or similar description.

The base chip 102 includes a ground exterior connector backside pad 172-G, a first power supply voltage exterior connector backside pad 172-V1, a second power supply voltage exterior connector backside pad 172-V2, a first input/output exterior connector backside pad 172-101, and a second input/output exterior connector backside pad 172-102. The ground exterior connector backside pad 172-G is connected to a ground node GND in the base chip 102. The first power supply voltage exterior connector backside pad 172-V1 is connected to a first power supply voltage node VCC1 in the base chip 102. The second power supply voltage exterior connector backside pad 172-V2 is connected to a second power supply voltage node VCC2 in the base chip 102. Each of the ground node GND and power supply voltage nodes VCC1, VCC2 can be implemented, at least in part, as a grid or plane within the base chip 102.

The ground node GND is connected through Z-interfaces 232-238 (e.g., through passive connections) to each of the intermediate chips 104, 106 and distal chip 108. For example, stack(s) of vias, metal lines, and TSVs (e.g., in front side and backside dielectric layer(s) and semiconductor substrate of a chip like illustrated in FIG. 1) can be implemented as passive connections in a respective Z-interface 232-238 in each of the chips 102-108 to connect the ground node GND to each of the intermediate chips 104, 106 and distal chip 108. The ground node GND can be implemented, as least in part, as respective grids or planes within the chips 104-108.

Similarly, the first power supply voltage node VCC1 is connected through Z-interfaces 232-238 (e.g., through passive connections) to each of the intermediate chips 104, 106 and distal chip 108. For example, stack(s) of vias, metal lines, and TSVs can be implemented as passive connections in a respective Z-interface 232-238 in each of the chips 102-108 to connect the first power supply voltage node VCC1 to each of the intermediate chips 104, 106 and distal chip 108. The first power supply voltage node VCC1 can be implemented, as least in part, as respective grids or planes within the chips 104-108.

Similarly, the second power supply voltage node VCC2 is distributed as separate second power supply voltage nodes VCC2-1, VCC2-2 in each of the intermediate chips 104, 106. Each of the separate second power supply voltage nodes VCC2-1, VCC2-2 is connected to the second power supply voltage node VCC2 through Z-interfaces 232-236 (e.g., through passive connections) to each of the intermediate chips 104, 106. For example, stack(s) of vias, metal lines, and TSVs can be implemented as passive connections in a respective Z-interface 232-236 in each of the chips 102-106 to connect the second power supply voltage node VCC2 to the separate second power supply voltage nodes VCC2-1, VCC2-2 of each of the intermediate chips 104, 106. The second power supply voltage nodes VCC2-1, VCC2-2 can be implemented, as least in part, as respective grids or planes within the chips 104, 106.

The distribution of power supply voltages as shown in FIG. 3 and described herein is merely an example to illustrate different aspects of examples. Some examples can implement a single power supply voltage node or different numbers of power supply voltage nodes between multiple chips. A person having ordinary skill in the art will readily envisage different modifications and permutations based on the illustrated example.

The base chip 102 includes functional circuits 302-1, 302-2 each connected between a respective power supply voltage node VCC1, VCC2 and the ground node GND. The functional circuits 302-1, 302-2 have respective input/output nodes that are connected to the input/output exterior connector backside pads 172-101, 172-102. Various diodes are connected between the respective input/output nodes of the functional circuits 302-1, 302-2 and the respective power supply voltage node VCC1, VCC2, and between the respective input/output nodes of the functional circuits 302-1, 302-2 and the ground node GND. A cathode of diode 312-11 is connected to the first power supply voltage node VCC1, and an anode of the diode 312-11 is connected to the input/output node of the functional circuit 302-1. A cathode of diode 312-12 is connected to the input/output node of the functional circuit 302-1, and an anode of the diode 312-12 is connected to the ground node GND. A cathode of diode 312-21 is connected to the second power supply voltage node VCC2, and an anode of the diode 312-21 is connected to the input/output node of the functional circuit 302-2. A cathode of diode 312-22 is connected to the input/output node of the functional circuit 302-2, and an anode of the diode 312-22 is connected to the ground node GND.

The intermediate chips 104, 106 and distal chip 108 include respective combinations of a functional circuit 30x and a power-gating transistor 37x connected between a power supply voltage node VCCx and the ground node GND. The power-gating transistors 37x can be, for example, p-type transistors. A source node of the power-gating transistor 37x is connected to the power supply voltage node VCCx, and a drain node of the power-gating transistor 37x is connected to a positive power supply node of the functional circuit 30x. A negative power supply node of the functional circuit 30x is connected to the ground node GND. A gate node of the power-gating transistor 37x can be connected to a control node that is configured propagate a signal to control whether the power-gating transistor 37x is in a closed (e.g., conducting) state or an open (e.g., non-conducting) state.

A RC clamp 32x is connected between a respective power supply voltage node VCCx and the ground node GND. Each power supply voltage node VCC1, VCC2, VCC2-1, VCC2-1 on each chip 102-108 has a RC clamp 32x connected between the respective power supply voltage node VCCx and the ground node GND. The RC clamp 32x includes a discharge transistor 33x (e.g., an n-type transistor), an inverter 34x, a resistor 35x, and a capacitor 36x. The discharge transistor 33x has a drain node connected to the power supply voltage node VCCx and has a source node connected to the ground node GND. A gate node of the discharge transistor 33x is connected to an output node of the inverter 34x. A first terminal of the resistor 35x is connected to the power supply voltage node VCCx, and a second terminal (opposite from the first terminal) of the resistor 35x is connected to an input node of the inverter 34x and a first terminal of the capacitor 36x. A second terminal (opposite from the first terminal) of the capacitor 36x is connected to the ground node GND.

In operation, while the voltages of the power supply voltage node VCCx and ground node GND are stable (e.g., in the absence of an ESD event), the voltage drop across the capacitor 36x is generally the difference between the voltage $V_{CC}$ of the power supply voltage node VCCx and the voltage $V_{GND}$ of the ground node GND (e.g., $V_{CC}$-$V_{GND}$). This voltage across the capacitor 36x (e.g., $V_{CC}$-$V_{GND}$) causes the voltage/signal on the input node of the inverter 34x to be logically high, which causes the inverter 34x to output a logically low signal on its output node and to the gate node of the discharge transistor 33x. A logically low signal at the gate node of the discharge transistor 33x (e.g., $V_{GS}$=0 V) causes the discharge transistor 33x to be non-conducting through its channel (e.g., from the drain node, through the channel, and to the source node).

When an ESD event occurs and ESD charge is on the power supply voltage node VCCx, initially, the voltage drop across the capacitor 36x is generally the difference between the voltage $V_{CC}$ of the power supply voltage node VCCx and the voltage $V_{GND}$ of the ground node GND (e.g., $V_{CC}$-$V_{GND}$), and the voltage drop across the resistor 35x is the additional voltage $V_{ESD}$ induced by the ESD event. At this point, the voltage on the power supply voltage node VCCx is $V_{CC}$+$V_{ESD}$. If the additional voltage $V_{ESD}$ induced by the ESD event is sufficiently large, the difference between the voltage of the input node of the inverter 34x (which is the voltage drop across the capacitor 36x (e.g., $V_{CC}$-$V_{GND}$) and the voltage of the power supply voltage node VCCx (e.g., $V_{CC}$+$V_{ESD}$) can cause the inverter 34x to output a logically high signal (e.g., $V_{CC}$+$V_{ESD}$ on the power supply voltage node VCCx) on its output node and to the gate node of the discharge transistor 33x. This logically high signal at the gate node of the discharge transistor 33x (e.g., $V_{GS}$=$V_{CC}$ $V_{ESD}$) causes the discharge transistor 33x to be conducting through its channel (e.g., from the drain node, through the channel, and to the source node), which dissipates the ESD charge of the ESD event from the power supply voltage node VCCx.

While the ESD charge persists on the power supply voltage node VCCx, the voltage drop across the capacitor 36x increases as a function of the RC-time constant resulting from the resistance value of the resistor 35x and the capacitance value of the capacitor 36x. Generally, the RC-time constant should be sufficiently large such that the increase in voltage drop across the capacitor 36x during the ESD event does not cause the voltage input to the inverter 34x, and responsively the signal output from the inverter 34x, to cause the discharge transistor 33x to become in a non-conducting state before the ESD charge is sufficiently dissipated.

Two types of ESD events have been modeled. One is the Human Body Model (HBM). In the HBM, an electrostatic charge from a source outside of the electronic device, such as a human body, is discharged on an external terminal of the electronic device. For example, with reference to FIG. 3, a source (e.g., a human body) can come into contact with an exterior connector backside pad 172-V1, 172-V2, 172-101, 172-102 and discharge the electrostatic charge on that exterior connector backside pad. The electrostatic charge can be dissipated to the ground node GND through the RC clamp 322-x, for example. Another modeled ESD event is the Charged Device Model (CDM). In CDM, an electrostatic charge accumulates within the electronic device and suddenly discharges. For example, handling of the chip stack of FIG. 3 can cause accumulation of electrostatic charge within any chip 102-108, and when the ESD event occurs, the ESD charge can be dissipated to the ground node GND through an RC clamp 32x.

In HBM, the voltage of an ESD event at the terminal of an electronic device can be large, such on the order of thousands of volts (e.g., from about 1.5 kV to about 2 kV). Since the voltage of the ESD event is caused by an external source, the resistance of the external source affects the current through the electronic device during the ESD event. For example, skin of a human body can be modeled at approximately 1.5 kΩ, where the ESD voltage is 1.5 kV, which can result in approximately 1 A or less of current through the electronic device resulting from the ESD event. The rise time of voltage induced by an ESD event according to the HBM can be on the order of a few nanoseconds (e.g., from about 5 ns to about 10 ns), and a decay time of such voltage can be on the order of a hundred to a few hundred nanoseconds (e.g., approximately 150 ns).

In CDM, the voltage induced by the ESD event can be significantly less than the voltage of an ESD event according to the HBM. In CDM, the voltage induced by the ESD event can be on the order of a few hundred volts (e.g., from about 125 V to about 250 V). However, since the charge is internal to the electronic device (e.g., no resistance of an external source), a current caused by the ESD event according to the CDM can be higher than an ESD event according to HBM. The rise time of voltage induced by an ESD event according to the CDM can be on the order of a few hundred picoseconds (e.g., from about 200 ps to about 300 ps), and a decay time of such voltage can be on the order of a hundred to a few nanoseconds (e.g., from about 1 ns to about 2 ns).

The physical configuration of the chip stack of FIGS. 1 through 3 can have physical attributes that cause an ESD event according to the HBM to be contained within the base chip 102. For example, resistances of Z-interfaces 232-238 (e.g., stack(s) of vias, metal lines, and TSVs) that form and/or connect the various power supply voltage nodes VCCx to the chips 104-108 overlying the base chip 102 can be sufficient high that a lower resistance path of the ESD discharge is through one or more RC clamps 322-*x* disposed in the base chip 102. Hence, an ESD discharge according to the HBM can be contained within and discharged through the base chip 102 without being discharged through the chips 104-108. It is worth noting that chips 104-108 do not have external terminals that an external source can contact, so the chips 104-108 do not experience an ESD event according to the HBM like the base chip 102, which has external terminals, such as exterior connector backside pads 172-V1, 172-V2, 172-I01, 172-I01, may experience.

Electrostatic charge can accumulate in any of the chips 102-108, and hence, an ESD event according to the CDM can occur in any of the chips 102-108. As indicated above, a pulse width (e.g., including a rise time and decay time) of a voltage of an ESD event according to the CDM is generally an order of magnitude or more less than a pulse width of a voltage of an ESD event according to the HBM.

Accordingly, each of the chips 102-108 includes RC clamps 32*x* capable of discharging electrostatic charge of an ESD event caused according to the CDM, and only the base chip 102 includes RC clamps 322-*x* capable of discharging electrostatic charge of an ESD event caused according to the HBM. To accommodate the relatively long rise and decay times of an ESD event caused according to the HBM, the RC-time constants of the RC clamps 322-*x* in the base chip 102 are relatively large. These relatively large RC-time constants cause the voltage drop across the capacitor 362-*x* to increase relatively slowly during an ESD event such that the discharge transistor 332-*x* is less likely to prematurely change to a non-conducting state during the ESD event. Since discharge of an ESD event caused according to the HBM can be contained within the base chip 102, and ESD events caused according to CDM have relatively short rise and decay times, the RC-time constants of the RC clamps 324-*x*, 326-*x*, 328 of chips 104, 106, 108 can be relatively small. According to some examples, the RC-time constants of the RC clamps 322-*x* are larger than the RC-time constants of the RC clamps 324-*x*, 326-*x*, 328. For example, the RC-time constants of the RC clamps 322-*x* can be an order of magnitude larger than the RC-time constants of the RC clamps 324-*x*, 326-*x*, 328. The RC-time constants of the RC clamps 322-*x* can correspond to, e.g., on the order of a few hundred microseconds (e.g., three orders of magnitude greater or more than the pulse width of an ESD event according to the HBM), and the RC-time constants of the RC clamps 324-*x*, 326-*x*, 328 can correspond to, e.g., on the order of a few microseconds (e.g., three orders of magnitude greater or more than the pulse width of an ESD event according to the CDM).

Figure 4:
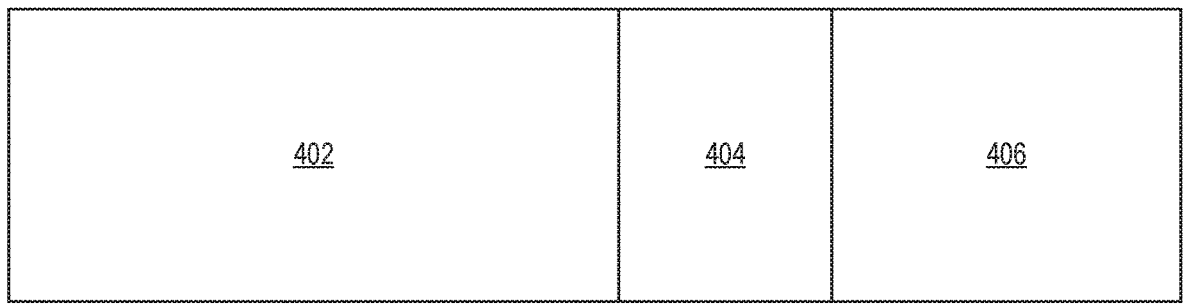
FIG. 4 depicts respective footprints of a transistor, capacitor, and resistor of an RC clamp in a base chip of the chip stack of FIGS. 1 through 3 according to some examples.

The larger RC-time constants of the RC clamps 322-*x* can each be implemented by a resistor 352-*x* having a larger area footprint in the chip 102, and/or a capacitor 362-*x* having a larger area footprint in the chip 102. For example, FIG. 4 illustrates a footprint 402 of the discharge transistor 332-*x*, a footprint 404 of the capacitor 362-*x*, and a footprint 406 of the resistor 352-*x*. Each footprint shows an area in or parallel to a major surface (e.g., a front surface surface) of the semiconductor substrate of the respective chip in which the transistor, capacitor, and/or resistor is disposed. Each footprint generally illustrates a lateral boundary in which generally only the corresponding component (e.g., not considering other components for connections) is disposed.

Figure 5:
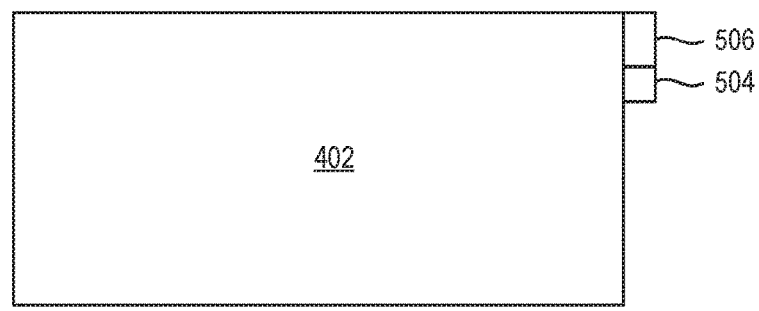
FIG. 5 depicts respective footprints of a transistor, capacitor, and resistor of an RC clamp in an intermediate chip or distal chip of the chip stack of FIGS. 1 through 3 according to some examples.

The smaller RC-time constants of the RC clamps 324-*x*, 326-*x*, 328 can each be implemented by a resistor 35*x* having a smaller area footprint in the chip 104-108, and/or a capacitor 36*x* having a smaller area footprint in the chip 104-108. For example, FIG. 5 illustrates a footprint 402 of the discharge transistor 33*x* (which, in this example, has a same footprint 402 of the discharge transistor 332-*x* in FIG. 4), a footprint 504 of the capacitor 36*x*, and a footprint 506 of the resistor 35*x*. The footprint 504 is smaller than the footprint 404, and the footprint 506 is smaller than the footprint 406. The collective or combined footprint of the footprints 504, 506 can be smaller than the collective or combined footprint of the footprints 404, 406. The footprint 404 can be two or more times larger than the footprint 504, and the footprint 406 can be two or more times larger than the footprint 506. The collective or combined footprint of the footprints 404, 406 can be two or more times larger than the collective or combined footprint of the footprints 504, 506.

Each resistor can be implemented by metal lines and/or vias (e.g., in a serpentine pattern) in front side dielectric layer(s) of the respective chip, one or more diffusion region in the semiconductor substrate of the respective chip, or a combination thereof. Each resistor can be disposed within the respective footprint. Similarly, each capacitor can be implemented by two plates of metal lines and/or vias (e.g., with interlocking fingers) in front side dielectric layer(s) of the respective chip, one or more diffusion region in the semiconductor substrate of the respective chip, or a combination thereof. Each capacitor can be disposed within the respective footprint.

The circuit schematic of FIG. 3 is illustrated to show various aspects of examples in relation to FIG. 2. For example, the functional circuits 304-1, 306-1 can be respective programmable interconnects of PL regions 224, 226. The functional circuits 304-2, 306-2 can be configuration memory (e.g., configuration random access memory (CRAM)) that is configured to store configuration data that programs or configures a user design or circuit in the PL regions 224, 226. The functional circuits 304-3, 306-3 can be various other components and circuits within the respective intermediate chips 104, 106. Similarly, the functional circuits 302-1, 302-2 can be different input/output circuits on the base chip 102. The functional circuit 308 can be any circuit or component on the distal chip 108. Different examples can have different distributions of power, which can result in different circuit schematics, as readily understood by a person having ordinary skill in the art.

Figure 6:
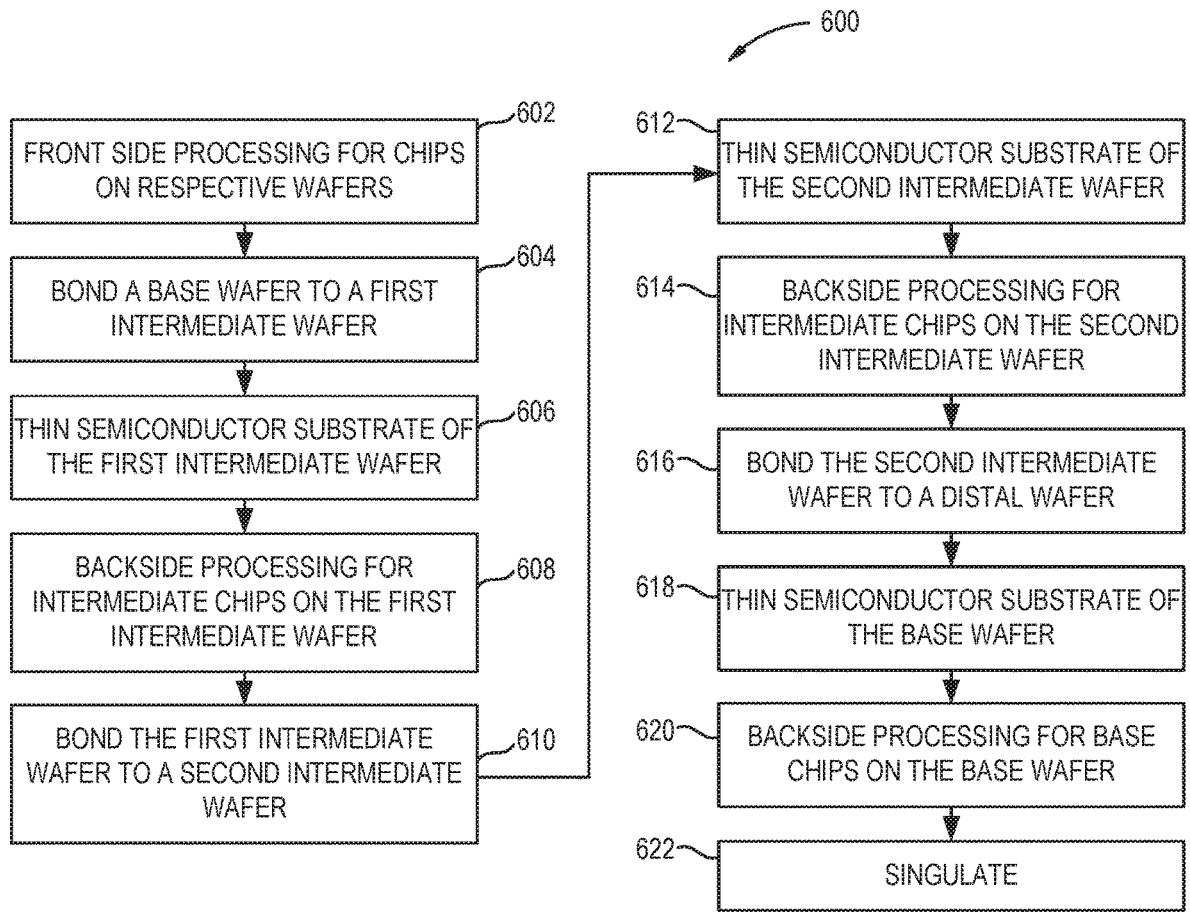
FIG. 6 is a flowchart of a method of forming the multi-chip device of FIGS. 1 through 3 according to some examples.

FIG. 6 is a flowchart of a method 600 of forming the multi-chip device of FIGS. 1 through 3 according to some examples. A person having ordinary skill in the art will readily understand modifications to achieve other multi-chip devices. The processing of the method 600 of FIG. 6 is generally described, and a person having ordinary skill in the art will readily understand the more specific processing that can be performed. The more specific processing can be according to any semiconductor processing for forming an IC on substrate, which is to be singulated into a chip. For ease of description herein, a wafer on which one or more base chips 102 are formed is referred to as a base wafer; a wafer on which one or more intermediate chips 104, 106 are formed is referred to as an intermediate wafer; and a wafer on which one or more distal chips 108 are formed is referred to as a distal wafer. Any wafer can be any shape and/or size.

At block 602, front side processing for chips on the respective wafers is performed. For example, front side processing of each semiconductor substrate 112, 114, 116, 118 (e.g., wafer) can include forming devices (e.g., transistors 142, 144, 146, 148) in and/or on the front surface of the semiconductor substrate 112, 114, 116, 118, and forming front side dielectric layer(s) 122, 124, 126, 128 with metallizations and front side bond pads 152, 154, 156, 158 on the front surface of the semiconductor substrate 112, 114, 116, 118. Multiple base chips 102 can be formed on a base wafer. Multiple intermediate chips 104, 106 can be formed on each of a plurality of intermediate wafers. Multiple distal chips 108 can be formed on a distal wafer.

At block 604, a base wafer is bonded to a first intermediate wafer, such as front side to front side bonding as shown in FIG. 1. As a result of the bonding, a front side of a base chip 102 is bonded to a front side of an intermediate chip 104, as shown in FIG. 1. The bonding can be hybrid bonding, such as bonding front side bond pads 152 on the base wafer to front side bond pads 154 on the first intermediate wafer, and bonding the exterior surface of the front side dielectric layer(s) 122 on the base wafer to the exterior surface of the front side dielectric layer(s) 124 on the first intermediate wafer.

At block 606, the semiconductor substrate of the first intermediate wafer is thinned from a backside of the first intermediate wafer. As show in FIG. 1, the semiconductor substrate 114 of the intermediate chip 104 is thinned from the backside. The thinning can be by a chemical mechanical polish (CMP) or other appropriate process. At block 608, backside processing for intermediate chips on the first intermediate wafer is performed. As illustrated by FIG. 1, the backside processing can include forming backside TSVs 164 through the semiconductor substrate 114 of the first intermediate wafer and connecting to metallization in the front side dielectric layer(s) 124 on the first intermediate wafer. The backside processing can further include forming backside dielectric layer(s) 134 with metallizations and backside bond pads 174 on the backside of the semiconductor substrate 114. The metallizations in the backside dielectric layer(s) 134 can be connected to the metallizations in the front side dielectric layer(s) 124 through the backside TSVs 164.

At block 610, the first intermediate wafer is bonded to a second intermediate wafer, such as backside to front side bonding as shown in FIG. 1. As a result of the bonding, a backside of an intermediate chip 104 is bonded to a front side of an intermediate chip 106, as shown in FIG. 1. The bonding can be hybrid bonding, such as bonding backside bond pads 174 on the first intermediate wafer to front side bond pads 156 on the second intermediate wafer, and bonding the exterior surface of the backside dielectric layer(s) 134 on the first intermediate wafer to the exterior surface of the front side dielectric layer(s) 126 on the second intermediate wafer.

At block 612, the semiconductor substrate of the second intermediate wafer is thinned from a backside of the second intermediate wafer, like described with respect to block 606. As show in FIG. 1, the semiconductor substrate 116 of the intermediate chip 106 is thinned from the backside.

At block 614, backside processing for intermediate chips on the second intermediate wafer is performed, like described with respect to block 608. As illustrated by FIG. 1, the backside processing can include forming backside TSVs 166 through the semiconductor substrate 116 of the second intermediate wafer and connecting to metallization in the front side dielectric layer(s) 126 on the second intermediate wafer. The backside processing can further include forming backside dielectric layer(s) 136 with metallizations and backside bond pads 176 on the backside of the semiconductor substrate 116. The metallizations in the backside dielectric layer(s) 136 can be connected to the metallizations in the front side dielectric layer(s) 126 through the backside TSVs 166.

At block 616, the second intermediate wafer is bonded to a distal wafer, such as backside to front side bonding as shown in FIG. 1. As a result of the bonding, a backside of an intermediate chip 106 is bonded to a front side of a distal chip 108, as shown in FIG. 1. The bonding can be hybrid bonding, such as bonding backside bond pads 176 on the second intermediate wafer to front side bond pads 158 on the distal wafer, and bonding the exterior surface of the backside dielectric layer(s) 136 on the second intermediate wafer to the exterior surface of the front side dielectric layer(s) 128 on the distal wafer.

At block 618, the semiconductor substrate of the base wafer is thinned from a backside of the base wafer, like described with respect to block 606. As show in FIG. 1, the semiconductor substrate 112 of the base chip 102 is thinned from the backside.

At block 620, backside processing for base chips on the base wafer is performed, like described with respect to block 608. As illustrated by FIG. 1, the backside processing can include forming backside TSVs 162 through the semiconductor substrate 112 of the base wafer and connecting to metallization in the front side dielectric layer(s) 122 on the base wafer. The backside processing can further include forming backside dielectric layer(s) 132 with metallizations and exterior connector backside pads 172 on the backside of the semiconductor substrate 112. The metallizations in the backside dielectric layer(s) 132 can be connected to the metallizations in the front side dielectric layer(s) 122 through the backside TSVs 162. The backside processing for the base chips 102 can further include forming the passivation layer 180 and external connectors 182. At block 622, the bonded wafers are singulated (e.g., by sawing) to separate individual multi-chip devices that have been formed. Each of the multi-chip devices can be as shown in FIG. 1.

The various operations of blocks of the method 600 can be repeated and/or omitted to form various multi-chip devices. The method 600 has been provided as an example of how some multi-chip devices can be formed. In other examples, some operations can be performed in parallel. For example, multiple different wafer stacks can be formed (e.g., by bonding and processing respective wafers) in parallel before the multiple different wafer stacks are then bonded together and further processed to form the multi-chip devices. A person having ordinary skill in the art will readily understand how to form other multi-chip devices based on the description of the method 600 above.

Figure 7:
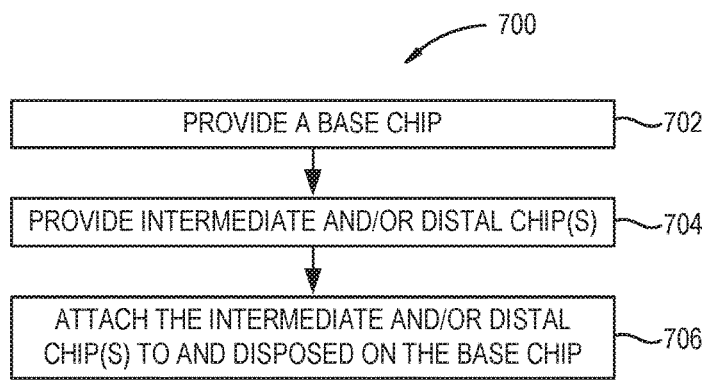
FIG. 7 is a flowchart of a method of providing the multi-chip device of FIGS. 1 through 3 according to some examples.

FIG. 7 is a flowchart of a method 700 of providing a multi-chip device according to some examples. At block 702, a base chip is provided. The base chip can be provided based on processing as described above with respect to the method 600 of FIG. 6, such as the front side processing of block 602, the thinning of block 618, and the backside processing of block 620. Like described with respect to FIG. 3, the base chip includes a ground exterior connector pad (e.g., ground exterior connector backside pad 172-G), a power supply voltage exterior connector pad (e.g., first power supply voltage exterior connector backside pad 172-V1), and an input/output exterior connector pad (e.g., first input/output exterior connector backside pad 172-I01). The ground exterior connector pad is connected to a ground node in the base chip (e.g., ground node GND within the base chip 102). The power supply voltage exterior connector pad is connected to a power supply voltage node in the base chip (e.g., power supply voltage node VCC1 within the base chip 102). The input/output exterior connector pad is connected to an input/output node in the base chip (e.g., an input/output node of the functional circuit 302-1). An RC clamp (e.g., RC clamp 322-1) is connected to and between the ground node and the power supply voltage node in the base chip 102. An input/output circuit (e.g., functional circuit 302-1) is connected to and between the ground node and the power supply voltage node in the base chip 102.

At block 704, an intermediate and/or distal chip(s) are provided. The intermediate and/or distal chip(s) can be provided based on processing as described above with respect to the method 600 of FIG. 6, such as the front side processing of block 602, the thinning of blocks 606, 612, and the backside processing of blocks 608, 614. One or more of the intermediate and/or distal chip(s) can include a respective RC clamp. As illustrated in FIG. 3, each of the intermediate and distal chips include a respective RC clamp (e.g., RC clamp 324-2, 326-1, 328). Within the respective intermediate chip 104, 106 and/or distal chip 108, the respective RC clamp is connected to and between a ground node in the respective chip 104-108 (e.g., ground node GND) and a power supply voltage node in the respective chip 104-108 (e.g., power supply voltage node VCC1). For each of the chips 104-108 that includes such an RC clamp, an RC-time constant of the RC clamp in the respective chip 104-108 is less than an RC-time constant of the RC clamp in the base chip 102.

At block 706, the intermediate and/or distal chip(s) is attached to and disposed on the base chip. For example, intermediate and/or distal chip(s) can be bonded to the base chip, e.g., by hybrid bonding. The intermediate and/or distal chip(s) can be attached to and disposed on the base chip based on processing as described above with respect to the method 600 of FIG. 6, such as the bonding of blocks 604, 610, 616. Attaching intermediate and/or distal chip(s) to the base chip connects the ground nodes in the base chip and intermediate and/or distal chip(s) to form a ground node extending in the chips, and connects the power supply voltage nodes in the base chip and intermediate and/or distal chip(s) to form a power supply voltage node extending in the chips. Various other aspects of the device have been described above, such as with respect to FIGS. 1 through 5.

While the foregoing is directed to specific examples, other and further examples may be devised without departing from the basic scope thereof, and the scope thereof is determined by the claims that follow.

What is claimed is:

1. A device comprising:
a chip stack comprising:
a first chip having a ground exterior connector pad and a power supply voltage exterior connector pad;
a second chip disposed on and attached to the first chip;
a ground node connected between and extending in the first chip and the second chip, the ground node being connected to the ground exterior connector pad;
a power supply voltage node connected between and extending in the first chip and the second chip, the power supply voltage node being connected to the power supply voltage exterior connector pad;
a first resistor-capacitor (RC) clamp disposed in the first chip, the first RC clamp being connected to and between the ground node and the power supply voltage node; and
a second RC clamp disposed in the second chip, the second RC clamp being connected to and between the ground node and the power supply voltage node, an RC-time constant of the second RC clamp being less than an RC-time constant of the first RC clamp.

2. The device of claim 1 further comprising an input/output circuit disposed in the first chip, the input/output circuit being connected to and between the ground node and the power supply voltage node, the first chip further having an input/output exterior connector pad, the input/output circuit having an input/output node connected to the input/output exterior connector pad.

3. The device of claim 1, wherein the second chip is hybrid bonded to the first chip.

4. The device of claim 1, wherein the second chip does not have an exterior connector pad.

5. The device of claim 1, wherein:
the first RC clamp includes:
a first resistor having a first terminal connected to the power supply voltage node and having a second terminal opposite from the first terminal of the first resistor; and
a first capacitor having a first terminal connected to the second terminal of the first resistor and having a second terminal opposite from the first terminal of the first capacitor and connected to the ground node; and
the second RC clamp includes:
a second resistor having a first terminal connected to the power supply voltage node and having a second terminal opposite from the first terminal of the second resistor; and
a second capacitor having a first terminal connected to the second terminal of the second resistor and having a second terminal opposite from the first terminal of the second capacitor and connected to the ground node.

6. The device of claim 5, wherein:
the first resistor and the first capacitor have a first combined lateral footprint in the first chip;
the second resistor and the second capacitor have a second combined lateral footprint in the second chip; and
the first combined lateral footprint is larger than the second combined lateral footprint.

7. The device of claim 5, wherein:
the first RC clamp includes a first transistor having a channel connected between the power supply voltage node and the ground node; and
the second RC clamp includes a second transistor having a channel connected between the power supply voltage node and the ground node.

8. The device of claim 7, wherein:
the first transistor has a first transistor lateral footprint in the first chip;
the second transistor has a second transistor lateral footprint in the second chip; and
the first transistor lateral footprint is equal to the second transistor lateral footprint.

9. A method of providing a device, the method comprising:
providing a first chip including:
a ground exterior connector pad connected to a first ground node in the first chip;
a power supply voltage exterior connector pad connected to a first power supply voltage node in the first chip; and
a first resistor-capacitor (RC) clamp connected to and between the first ground node and the first power supply voltage node; and
providing a second chip including a second RC clamp connected to and between a second ground node in the second chip and a second power supply voltage node in the second chip, an RC-time constant of the second RC clamp being less than an RC-time constant of the first RC clamp; and attaching the second chip to and disposed on the first chip, attaching the second chip to the first chip including connecting the first ground node to the second ground node to form a ground node extending in the first chip and the second chip, and including connecting the first power supply voltage node to the second power supply voltage node to form a power supply voltage node extending in the first chip and the second chip.

10. The method of claim 9, wherein the first chip further includes:
   an input/output exterior connector pad connected to an input/output node in the first chip; and
   an input/output circuit connected to and between the first ground node and the first power supply voltage node, the input/output circuit being connected to the input/output node.

11. The method of claim 9, wherein attaching the second chip to the first chip includes bonding the second chip to the first chip.

12. The method of claim 9, wherein:
   the first RC clamp includes:
      a first resistor having a first terminal connected to the first power supply voltage node and having a second terminal opposite from the first terminal of the first resistor; and
      a first capacitor having a first terminal connected to the second terminal of the first resistor and having a second terminal opposite from the first terminal of the first capacitor and connected to the first ground node; and
   the second RC clamp includes:
      a second resistor having a first terminal connected to the second power supply voltage node and having a second terminal opposite from the first terminal of the second resistor; and
      a second capacitor having a first terminal connected to the second terminal of the second resistor and having a second terminal opposite from the first terminal of the second capacitor and connected to the second ground node.

13. The method of claim 12, wherein:
   the first resistor and the first capacitor have a first combined lateral footprint in the first chip;
   the second resistor and the second capacitor have a second combined lateral footprint in the second chip; and
   the first combined lateral footprint is larger than the second combined lateral footprint.

14. The method of claim 12, wherein:
   the first RC clamp includes a first transistor having a channel connected between the first power supply voltage node and the first ground node; and
   the second RC clamp includes a second transistor having a channel connected between the second power supply voltage node and the second ground node.

15. The method of claim 14, wherein:
   the first transistor has a first transistor lateral footprint in the first chip;
   the second transistor has a second transistor lateral footprint in the second chip; and
   the first transistor lateral footprint is equal to the second transistor lateral footprint.

16. A device comprising:
   a first chip including:
      a ground exterior connector pad connected to a ground node;
      a power supply voltage exterior connector pad connected to a power supply voltage node; and
      a first resistor-capacitor (RC) clamp connected to and between the ground node and the power supply voltage node; and
   a second chip bonded to and disposed on the first chip, the ground node and the power supply voltage node extending in the second chip, the second chip including a second RC clamp connected to and between the ground node and the power supply voltage node, an RC-time constant of the second RC clamp being less than an RC-time constant of the first RC clamp.

17. The device of claim 16, wherein the first chip further includes:
   an input/output exterior connector pad connected to an input/output node; and
   an input/output circuit connected to and between the ground node and the power supply voltage node, the input/output circuit being connected to the input/output node.

18. The device of claim 16, wherein:
   the first RC clamp includes:
      a first resistor having a first terminal connected to the power supply voltage node and having a second terminal opposite from the first terminal of the first resistor; and
      a first capacitor having a first terminal connected to the second terminal of the first resistor and having a second terminal opposite from the first terminal of the first capacitor and connected to the ground node; and
   the second RC clamp includes:
      a second resistor having a first terminal connected to the power supply voltage node and having a second terminal opposite from the first terminal of the second resistor; and
      a second capacitor having a first terminal connected to the second terminal of the second resistor and having a second terminal opposite from the first terminal of the second capacitor and connected to the ground node.

19. The device of claim 18, wherein:
   the first resistor and the first capacitor have a first combined lateral footprint in the first chip;
   the second resistor and the second capacitor have a second combined lateral footprint in the second chip; and
   the first combined lateral footprint is larger than the second combined lateral footprint.

20. The device of claim 18, wherein:
   the first RC clamp includes a first transistor having a channel connected between the power supply voltage node and the ground node;
   the second RC clamp includes a second transistor having a channel connected between the power supply voltage node and the ground node;
   the first transistor has a first transistor lateral footprint in the first chip;
   the second transistor has a second transistor lateral footprint in the second chip; and
   the first transistor lateral footprint is equal to the second transistor lateral footprint.

* * * * *